United States Patent
Kim et al.

(10) Patent No.: US 9,608,089 B2
(45) Date of Patent: Mar. 28, 2017

(54) METHOD OF MANUFACTURING THIN-FILM TRANSISTOR SUBSTRATE

(71) Applicant: SAMSUNG DISPLAY CO., LTD., Yongin-si, Gyeonggi-do (KR)

(72) Inventors: Jongyun Kim, Yongin-Si (KR); Waljun Kim, Yongin-Si (KR); Junghyun Kim, Yongin-Si (KR); Kiwan Ahn, Yongin-Si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/056,033

(22) Filed: Feb. 29, 2016

(65) Prior Publication Data

US 2017/0012112 A1    Jan. 12, 2017

(30) Foreign Application Priority Data

Jul. 9, 2015    (KR) .......................... 10-2015-0097859

(51) Int. Cl.
*H01L 29/786*    (2006.01)
*H01L 21/336*    (2006.01)
(Continued)

(52) U.S. Cl.
CPC .... *H01L 29/66757* (2013.01); *H01L 21/0273* (2013.01); *H01L 21/266* (2013.01);
(Continued)

(58) Field of Classification Search
CPC .. H01L 29/78621–29/78627; H01L 29/66757; H01L 29/4908;
(Continued)

(56) References Cited

U.S. PATENT DOCUMENTS 5,677,207 A * 10/1997 Ha .................... H01L 21/28035
257/E21.197
6,218,220 B1 * 4/2001 So ....................... H01L 29/4908
257/E29.151
(Continued)

FOREIGN PATENT DOCUMENTS

KR    10-1999-0076290    10/1999
KR    1999-0085497    12/1999
(Continued)

*Primary Examiner* — Marvin Payen
*Assistant Examiner* — Jeremy Joy
(74) *Attorney, Agent, or Firm* — F. Chau & Associates, LLC (57) ABSTRACT

Provided is a method of manufacturing a thin-film transistor substrate, the method includes forming a semiconductor pattern layer on a substrate. A first insulating film is formed on the semiconductor pattern layer. A metal pattern layer including a gate electrode and first and second alignment electrodes respectively spaced apart from two sides of the gate electrode is formed on the first insulating film. A cover layer covering the gate electrode is formed. The first and second alignment electrodes are removed. A first doping process is performed by doping the semiconductor pattern layer with a first impurity by using the cover layer as a mask. The cover layer is removed. A second doping process is performed by doping the semiconductor pattern layer with a second impurity having a lower impurity concentration than the first impurity by using the gate electrode as a mask.

19 Claims, 6 Drawing Sheets

(51) Int. Cl.
*H01L 27/12* (2006.01)
*H01L 29/66* (2006.01)
*H01L 21/266* (2006.01)
*H01L 21/027* (2006.01)
*H01L 21/3213* (2006.01)

(52) U.S. Cl.
CPC .... *H01L 21/32134* (2013.01); *H01L 27/1288* (2013.01); *H01L 29/78621* (2013.01)

(58) Field of Classification Search
CPC .................. H01L 29/66575–29/66598; H01L 21/027–21/0338; H01L 21/266; H01L 21/32; H01L 21/3215–21/32155; H01L 21/682; H01L 21/046–21/0465; H01L 21/26506–21/26533; H01L 21/42–21/426; H01L 21/823418–21/823431; H01L 21/823814; H01L 21/66575–21/66598; H01L 21/28123; H01L 23/544; H01L 2224/27005; H01L 2224/8013; H01L 2224/8113; H01L 2224/8213; H01L 2224/8313; H01L 2224/8413; H01L 2224/8513; H01L 2224/8613; H01L 2223/54426; H01L 27/1288; H01L 27/1214

See application file for complete search history.

(56) References Cited

U.S. PATENT DOCUMENTS

| | | | |
|---|---|---|---|
| 7,041,540 B1* | 5/2006 | Chang | H01L 29/78624 257/E21.336 |
| 9,269,796 B2* | 2/2016 | Yu | H01L 29/41733 |
| 2001/0008781 A1 | 7/2001 | Lee et al. | |
| 2003/0194839 A1* | 10/2003 | Chung | H01L 29/66772 438/151 |
| 2004/0214378 A1* | 10/2004 | Lin | H01L 29/78621 438/149 |
| 2004/0229415 A1 | 11/2004 | Takehashi et al. | |
| 2004/0262610 A1* | 12/2004 | Nam | H01L 27/1214 257/72 |
| 2006/0030089 A1 | 2/2006 | Chung | |
| 2007/0029614 A1* | 2/2007 | Shiota | H01L 27/1214 257/347 |
| 2010/0006847 A1* | 1/2010 | Hu | H01L 29/78621 257/66 |
| 2014/0103349 A1 | 4/2014 | Yu et al. | |
| 2015/0349098 A1* | 12/2015 | Yu | H01L 29/41733 438/104 |

FOREIGN PATENT DOCUMENTS

| | | |
|---|---|---|
| KR | 1999-0086657 | 12/1999 |
| KR | 20020032580 | 5/2002 |

* cited by examiner

METHOD OF MANUFACTURING THIN-FILM TRANSISTOR SUBSTRATE

CROSS-REFERENCE TO RELATED APPLICATION

This application claims priority under 35 U.S.C. §119 to Korean Patent Application No. 10-2015-0097859, filed on Jul. 9, 2015, in the Korean Intellectual Property Office, the disclosure of which is incorporated by reference herein in its entirety.

1. Technical Field

Exemplary embodiments of the present invention relate to a thin-film transistor, and more particularly to a method of manufacturing a thin-film transistor substrate.

2. Discussion of Related Art

An organic light-emitting display apparatus may include two electrodes and an organic emission layer disposed between the two electrodes. The organic light-emitting display apparatus may emit light as electrons injected from one electrode and holes injected from the other electrode combine in the organic emission layer to form excitons that emit energy.

The organic light-emitting display apparatus may include a plurality of pixels. Each pixel may include an organic light-emitting diode that may be a self-emission device. A plurality of thin-film transistors and at least one capacitor for driving the organic light-emitting diode may be formed in each pixel. The thin-film transistor may generate a driving current, but also may generate a leakage current.

SUMMARY

One or more exemplary embodiments of the present invention may include a method of manufacturing a thin-film transistor substrate.

According to one or more exemplary embodiments of the present invention, a method of manufacturing a thin-film transistor substrate includes forming a semiconductor pattern layer on a substrate. A first insulating film is formed on the semiconductor pattern layer. A metal pattern layer including a gate electrode and first and second alignment electrodes respectively spaced apart from two sides of the gate electrode is formed on the first insulating film. A cover layer covering the gate electrode is formed. The first and second alignment electrodes are removed. A first doping process is performed by doping the semiconductor pattern layer with a first impurity by using the cover layer as a mask. The cover layer is removed. A second doping process is performed by doping the semiconductor pattern layer with a second impurity having a lower impurity concentration than the first impurity by using the gate electrode as a mask.

In the performing of the first doping process, the semiconductor pattern layer may include a first region, and second and third regions respectively disposed at two sides of the first region. The second and third regions may be doped with the first impurity.

In the performing of the second doping process, the first region of the semiconductor pattern layer may include a fourth region corresponding to a center region of the first region, and fifth and sixth regions respectively disposed at two sides of the fourth region. The fifth and sixth regions may be doped with the second impurity. The second and third regions may be again doped with the second impurity.

The fourth region may be formed at a location corresponding to the gate electrode and may have substantially a same width as the gate electrode.

A width of the cover layer may be substantially the same as a width of the first region.

The cover layer may be formed by forming a photoresist layer on the metal pattern layer, and then exposing and developing the photoresist layer by using a first mask having a first pattern. A width of the first pattern may be larger than a width of the cover layer.

The photoresist layer may include a pre-cover layer having substantially a same width as the first pattern via exposure. While developing the photoresist layer, the width of the pre-cover layer may be reduced to a width of the cover layer.

The pre-cover layer may include first and second end regions respectively disposed at both sides of the pre-cover layer. The first and second end regions may be moved towards a center of the cover layer while developing the photoresist layer.

The amount of light incident on at least one of the first and second end regions of the pre-cover layer may increase as a distance between the at least one of the first and second end regions and one of the first and second alignment electrodes, which is adjacent to the at least one of the first and second end regions, may decrease.

A moving distance of the at least one of the first and second end regions may increase as the distance between the at least one of the first and second end regions and one of the first and second alignment electrodes, which is adjacent to the at least one of the pair of end regions, may decrease.

The photoresist layer may include a positive type photoresist.

The first pattern may include a light blocker.

The first impurity and the second impurity may be a same material.

The first and second alignment electrodes may be removed via wet-etching.

A width of the metal pattern layer may be smaller than a width of the semiconductor pattern layer.

The first and second alignment electrodes may be respectively spaced apart from the two sides of the gate electrode at an equal distance.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Exemplary embodiments of the present invention will be described below in more detail with reference to the accompanying drawings. In this regard, the exemplary embodiments may have different forms and should not be construed as being limited to the exemplary embodiments of the present invention described herein.

In the specification and drawings, like reference numerals may refer to like elements.

It will be understood that although the terms "first" and "second" may be used herein to describe various components, these components should not be limited by these terms.

It will be understood that when a layer, region, or component is referred to as being "on" or "formed on" another layer, region, or component, it may be directly or indirectly formed on the other layer, region, or component. Intervening layers, regions, or components may be present.

Sizes of elements in the drawings may be exaggerated for clarity of description.

Exemplary embodiments of the present invention may be implemented differently than according to the exemplary embodiments of the present invention described herein, and a specific process order may be performed differently from the described order.

When layers, regions, or components are described as "connected," the layers, region, or components may be directly connected, or may be indirectly connected via another layer, region, or component.

Figure 1:
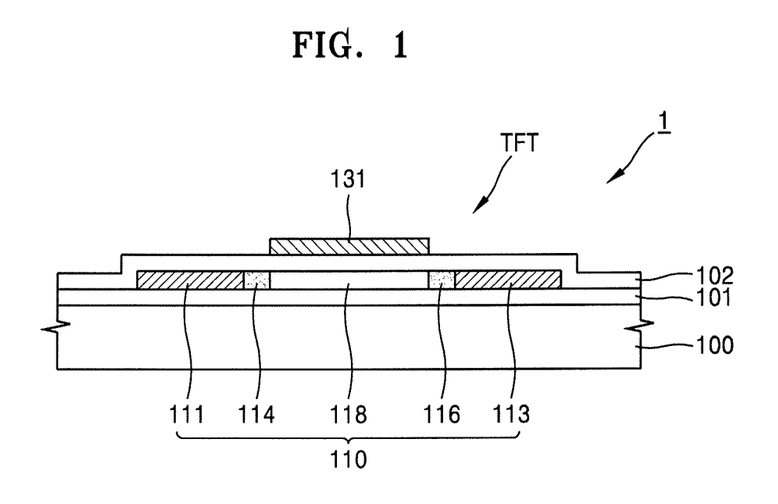
FIG. 1 is a cross-sectional view of a thin-film transistor substrate according to an exemplary embodiment of the present invention.

FIG. 1 is a cross-sectional view of a thin-film transistor substrate according to an exemplary embodiment of the present invention. FIGS. 2 through 8 are cross-sectional views describing a method of manufacturing the thin-film transistor substrate of FIG. 1.

Referring to FIG. 1, a thin-film transistor substrate 1 according to an exemplary embodiment of the present invention may include a thin-film transistor TFT disposed on a substrate 100. The thin-film transistor TFT may include a semiconductor pattern layer 110 (e.g., an active layer). A gate electrode 131 may be disposed on the semiconductor pattern layer 110. A gate insulating film 102 may be disposed between the semiconductor pattern layer 110 and the gate electrode 131.

The substrate 100 may include a transparent glass material including silicon dioxide ($SiO_2$). However, exemplary embodiments of the present invention are not limited thereto, and the substrate 100 may include ceramic, plastic, or stainless steel.

A buffer layer 101 may be disposed on the substrate 100. The buffer layer 101 may flatten the substrate 100 and may reduce or prevent impure elements from penetrating through the substrate 100. The buffer layer 101 may include a single layer or a plurality of layers, which may include an inorganic material, such as silicon nitride and/or silicon oxide.

The semiconductor pattern layer 110 may include a channel region 118, and source and drain regions 111 and 113 respectively disposed at two sides of the channel region 118. The semiconductor pattern layer 110 may include lightly doped drain (LDD) regions 114 and 116, which may be respectively disposed between the channel and source regions 118 and 111 and between the channel and drain regions 118 and 113.

The source and drain regions 111 and 113 may be doped with a first impurity. The first impurity may include boron ions or phosphorous ions, and a doping concentration of the source and drain regions 111 and 113 may be from about $1\times10^{12}$ atoms/cm$^2$ to about $1\times10^{16}$ atoms/cm$^2$. The source and drain regions 111 and 113 may respectively operate as a source electrode and a drain electrode.

The LDD regions 114 and 116 may be doped with a second impurity. The second impurity may include boron ions or phosphorous ions. A doping concentration of the second impurity may be from about $1\times10^{10}$ atoms/cm$^2$ to about $1\times10^{13}$ atoms/cm$^2$, which may be lower than the doping concentration of the first impurity. The LDD regions 114 and 116 may increase the reliability of the thin-film transistor TFT by reducing or eliminating a generation of hot carriers to increase a punch through characteristic generated by a short channel effect, even when the length of the channel region 118 decreases due to miniaturization of the thin-film transistor TFT.

The gate insulating film 102 may be disposed on the semiconductor pattern layer 110. The gate electrode 131 may be disposed at a location overlapping the semiconductor pattern layer 110. The gate insulating film 102 may be disposed between the gate electrode 131 and the semiconductor pattern layer 110.

The gate insulating film 102 may insulate the semiconductor pattern layer 110 and the gate electrode 131 from each other, and may include an organic material or an inorganic material such as $SiN_x$ or $SiO_2$.

The gate electrode 131 may include gold (Au), silver (Ag), copper (Cu), nickel (Ni), platinum (Pt), palladium (Pd), aluminum (Al), or molybdenum (Mo), or may include an alloy such as Al:Nd or Mo:W. However, exemplary embodiments of the present invention are not limited thereto, and the gate electrode 131 may include any desired material.

A method of manufacturing the thin-film transistor substrate 1 of FIG. 1 will be described in more detail below with reference to FIGS. 2 through 8.

Figure 2:
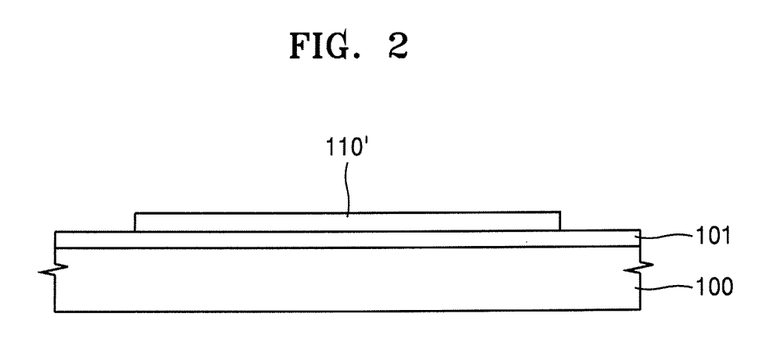
FIGS. 2 through 4, 5A, 5B and 6 through 8 are cross-sectional views describing a method of manufacturing the thin-film transistor substrate of FIG. 1.

Referring to FIG. 2, the semiconductor pattern layer 110 may be disposed on the substrate 100, on which the buffer layer 101 may be disposed.

The semiconductor pattern layer 110 may be formed by forming a semiconductor material on the substrate 100, and then patterning the semiconductor material. The semiconductor pattern layer 110 may be formed by coating a photoresist on the semiconductor material, and then patterning a semiconductor layer 110' via a photolithography process using a mask. The photolithography process may be performed by a series of processes, such as exposure on a mask by using an exposure device, and then developing, etching, and stripping or ashing.

The semiconductor material may include amorphous silicon or crystalline (polysilicon). Crystalline silicon may be formed by crystallizing amorphous silicon. Examples of a method of crystallizing amorphous silicon may include a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

The semiconductor pattern layer 110 may include the channel region 118, the source region 111, the drain region 113, and the LDD regions 114 and 116. The semiconductor pattern layer 110 may be formed by doping the semiconductor layer 110' with the first and second impurities, and may have substantially the same shape as the semiconductor layer 110'. The semiconductor layer may be interchangeably referred to as the semiconductor pattern layer.

Figure 3:
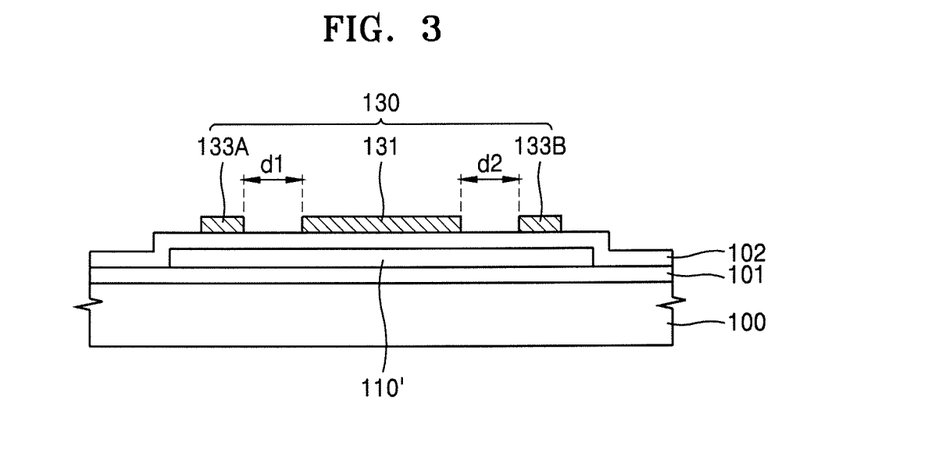

Referring to FIG. 3, the gate insulating film 102 may be formed on the substrate 100 and may cover the semiconductor pattern layer 110'. A metal pattern layer 130 may be formed on the gate insulating film 102.

The gate insulating film 102 may include an insulating material, such as silicon oxide or silicon nitride.

The metal pattern layer 130 may include the gate electrode 131 and alignment electrodes 133A and 133B. The alignment electrodes 133A and 133B may be respectively spaced apart from two sides of the gate electrode 131. The metal pattern layer 130 may be formed by forming a metal layer on the gate insulating film 102, and then patterning the metal layer. The metal layer may include a metal having relatively low resistance, and may include a single layer or a multi-layer including at least one metal from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The metal pattern layer 130 may overlap the semiconductor pattern layer 110'. The gate electrode 131 may be disposed in a center region of the semiconductor pattern layer 110', and the alignment electrodes 133A and 133B may be respectively spaced apart from two sides of the gate electrode 131 by a first distance d1 and a second distance d2. For example, the first and second distances d1 and d2 may be substantially identical. A width of the metal pattern layer 130 may be smaller than a width L2 (see, e.g., FIG. 6) of the semiconductor pattern layer 110'.

Figure 4:
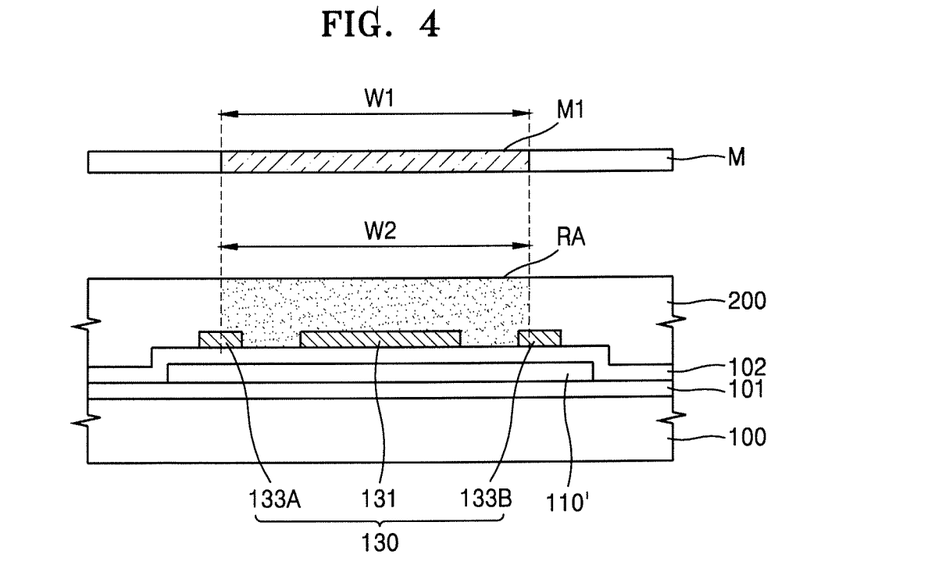

Referring to FIG. 4, a photoresist layer 200 may be formed on the metal pattern layer 130. The photoresist layer 200 may be exposed to light by using a first mask M.

The first mask M may include a first pattern M1 having a certain width. The first mask M may be spaced apart from the photoresist layer 200 with the first pattern M1 overlapping the metal pattern layer 130. According to an exemplary embodiment of the present invention, exposure may be performed by placing the first mask M on the photoresist layer 200, thus forming a pre-cover layer RA having a width W1 of the first pattern M1. The pre-cover layer RA may be a region formed in the photoresist layer 200 via exposure, and may be a region formed before a cover layer 250 (see, e.g., FIG. 5B) covering the metal pattern layer 130 is formed by developing the photoresist layer 200.

During a mask process, a mask may be disposed such that a pattern of the mask aligns with a region of a stacked film, which is to be patterned, but there may be an alignment error between the mask and the stacked film, and thus, a thin-film transistor having an LDD structure may have an asymmetrical LDD region due to the alignment error.

Figure 5A:
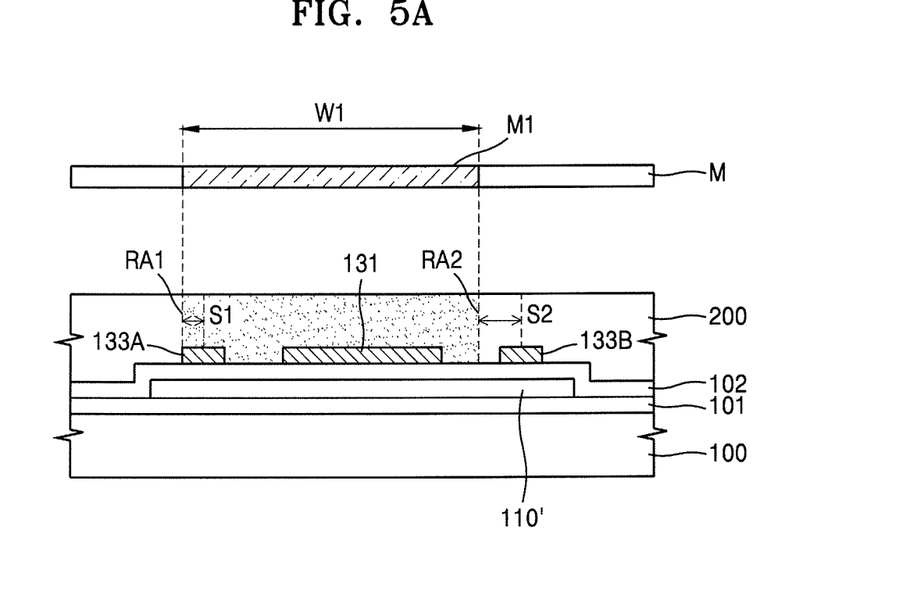
Figure 5B:
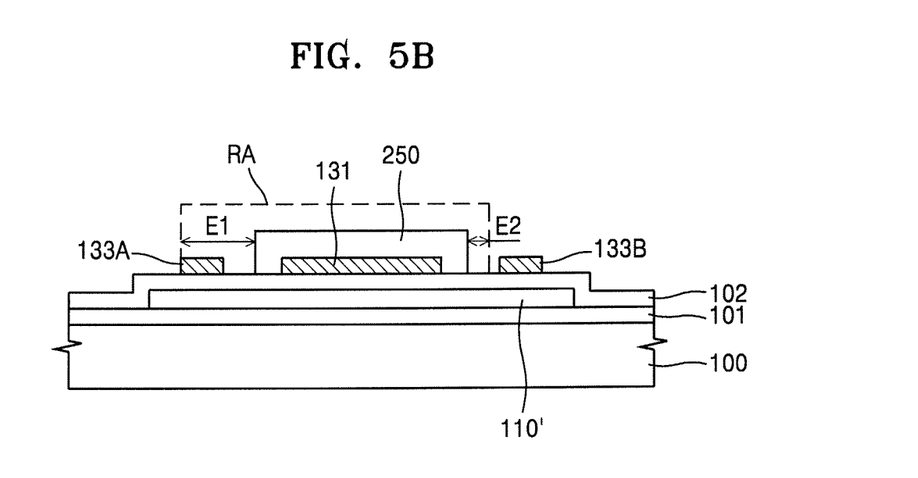

According to an exemplary embodiment of the present invention, even if a mask has an alignment error, the alignment electrodes 133A and 133B respectively disposed at the two sides of the gate electrode 131 may be used to manufacture a thin-film transistor substrate having a symmetrical LDD structure. FIGS. 5A and 5B illustrate an example of a case when the first mask M has an alignment error in a method of manufacturing a thin-film transistor substrate. Referring to FIG. 5A, when the first mask M has an alignment error, an end region RA1 of the pre-cover layer RA may be disposed on the alignment electrode 133A, and another end region RA2 of the pre-cover layer RA may spaced apart from the alignment electrode 133B.

The pre-cover layer RA may form a cover layer 250 when the photoresist layer 200 is developed. The shape of the pre-cover layer RA may be reduced into the shape of a cover layer 250 via developing.

A width W2 of the pre-cover layer RA reduced when the photoresist layer 200 is developed will be described below in more detail.

The end region RA1 and the other end region RA2 of the pre-cover layer RA may be reduced according to positions of the pair of alignment electrodes 133A and 133B.

For example, when the photoresist layer 200 is a positive type and the first pattern M1 of the first mask M is a light blocker, a region of the photoresist layer 200, which is exposed to light, may become soluble with respect to a developing solution. Accordingly, the pre-cover layer RA of the photo resist layer 200, which is not exposed to light by the first pattern M1, may become insoluble with respect to the developing solution, and the photoresist layer 200 exposed to light may be removed during developing. The photoresist layer 200 might not be accurately patterned in the same shape as the first pattern M1 due to light diffracted or scattered from two end regions of the first mask M. The end regions RA1 and RA2 of the pre-cover layer RA may be exposed to light due to diffraction or scattering, and a part of the pre-cover layer RA may become soluble with respect to the developing solution, and thus the size of the pre-cover layer RA may be adjusted towards a center of the cover layer 250 during developing.

When the alignment electrodes 133A and 133B, which may be metal layers, are disposed below the photoresist layer 200, light diffracted or scattered from the end region of the first mask M may be reflected at the alignment electrodes 133A and 133B and provided to the photoresist layer 200. Referring to FIGS. 5A and 5B, a distance S1 between the end region RA1 of the pre-cover layer RA and the alignment electrode 133A may be smaller than a distance S2 between the other end region RA2 of the pre-cover layer RA and the alignment electrode 133B (e.g., S1<S2). The photoresist layer 200 disposed on the alignment electrode 133A may be exposed to more light than the photoresist layer 200 spaced apart from the alignment electrode 133B. When the amount of light incident on the end region RA1 of the pre-cover layer RA, which may have the distance S1 from the alignment electrode 133A, is larger than the amount of light incident on the other end region RA2 of the pre-cover layer RA, a distance E1 with respect to the end region RA1 moved during developing may be greater than a distance E2 with respect to the other end region RA2 (e.g., E1>E2). The end region RA1 of the pre-cover layer RA may be shifted more toward the center region of the pre-cover layer RA than the other end region RA2 of the pre-cover layer RA.

Thus, the alignment error of the first mask M may be compensated for when the end regions RA1 and RA2 of the pre-cover layer RA are asymmetrically reduced during developing.

According to an exemplary embodiment of the present invention, a taper of an alignment electrode may be about 90°. According to another exemplary embodiment of the present invention, a taper of an alignment electrode may have an angle smaller than 90°, thus adjusting an amount of light incident on an end region of a pre-cover layer.

Figure 6:
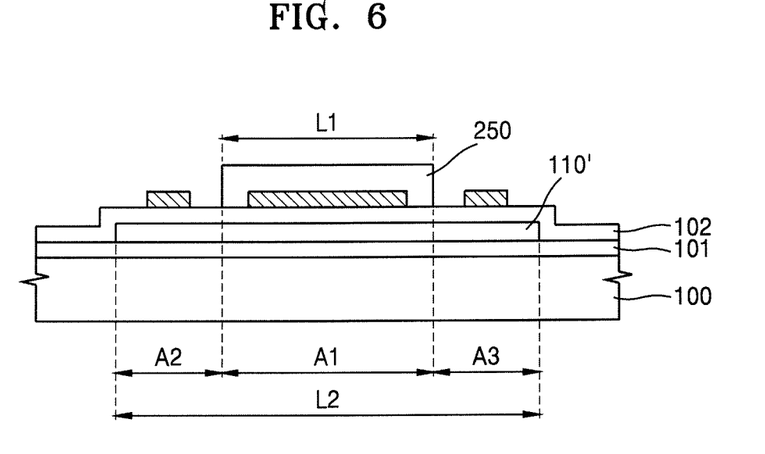

Referring to FIG. 6, the cover layer 250 may be formed by developing the pre-cover layer RA. A width L1 of the cover layer 250 may be smaller than a width of the first mask pattern M1 of the first mask M, but may cover the gate electrode 131. The cover layer 250 might not cover the pair of alignment electrodes 133A and 133B, and the pair of alignment electrodes 133A and 133B may be exposed.

The semiconductor pattern layer 110' may include a first region A1, and second and third regions A2 and A3 respectively disposed at two sides of the first region A1. The cover layer 250 may be disposed to correspond to the first region A1 of the semiconductor pattern layer 110', and the width L1 of the cover layer 250 may be substantially identical to a width of the first region A1.

Figure 7:
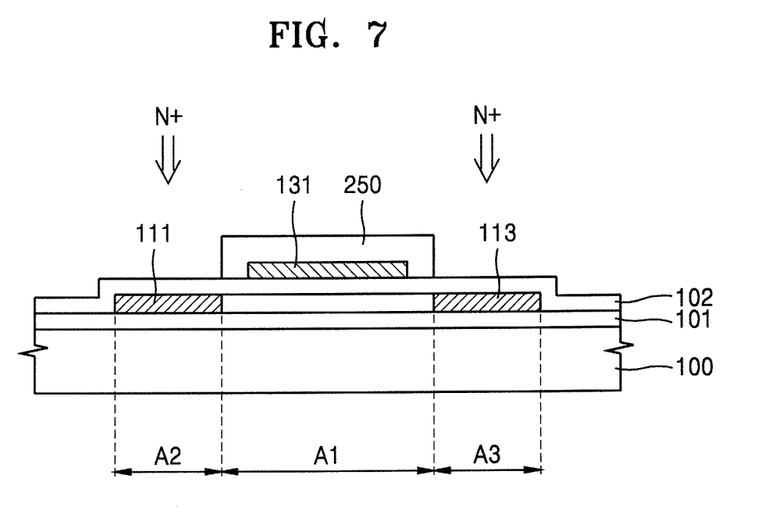

Referring to FIG. 7, after removing the pair of alignment electrodes 133A and 133B, the semiconductor pattern layer 110 may be doped with the first impurity.

The pair of alignment electrodes 133A and 133B, which are not covered by the cover layer 250, may be removed via wet etching.

Referring to FIG. 7, the first impurity may be an N-type impurity, but a type of the first impurity is not limited thereto. According to another exemplary embodiment of the present invention, the first impurity may be a P-type impurity.

When the first impurity is doped by using the cover layer 250 as a mask, the first impurity may be injected into the second and third regions A2 and A3 excluding the first region A1 of the semiconductor pattern layer 110. During a first doping process of injecting the first impurity, the first impurity may be injected at a relatively higher concentration than the second impurity injection in a second doping process. The second and third regions A2 and A3 may correspond to a source region or a drain region.

Figure 8:
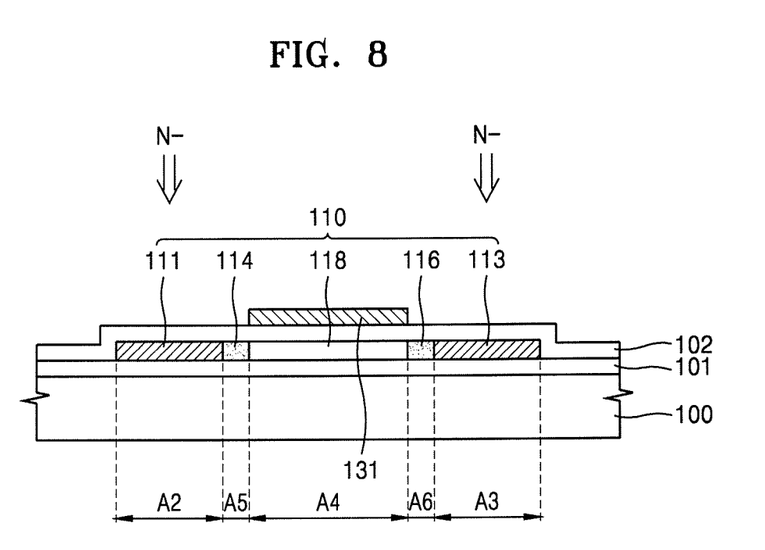

Referring to FIG. 8, after the cover layer 250 is removed, the semiconductor pattern layer 110 may be doped with the second impurity.

The cover layer 250 may be removed via a photoresist strip process.

The first region A1 of the semiconductor pattern layer 110 may include a fourth region A4 corresponding to a center region of the first region A1, and fifth and sixth regions A5 and A6 respectively disposed at two sides of the fourth region A4. The fourth region A4 may be disposed at a location corresponding to the gate electrode 131, and may have substantially the same width as the gate electrode 131. According to an exemplary embodiment of the present invention, when the semiconductor pattern layer 110 is doped with the second impurity by using the gate electrode 131 as a mask, the second, third, fifth, and sixth regions A2, A3, A5, and A6 of the semiconductor pattern layer 110, excluding the fourth region A4, may be doped with the second impurity. Unlike the second and third regions A2 and A3 doped with the first and second impurities, the fifth and sixth regions A5 and A6 may be only doped with the second impurity. When the second impurity has a lower concentration than the first impurity, the fifth and sixth regions A5 and A6 of the semiconductor pattern layer 110 may include the LDD regions 114 and 116. The channel region 118 into which the first and second impurities are not injected may be formed below the gate electrode 131. The source and drain regions 111 and 113, which may be relatively highly concentrated doping regions, the LDD regions 114 and 116, and the channel region 118 may be formed from outside the semiconductor pattern layer 110, and may be formed in the stated order.

Using a method of manufacturing a thin-film transistor substrate, according to an exemplary embodiment of the present invention, widths of LDD regions at two sides of a gate electrode may be substantially symmetrical even if a mask has an alignment error.

Figure 9:
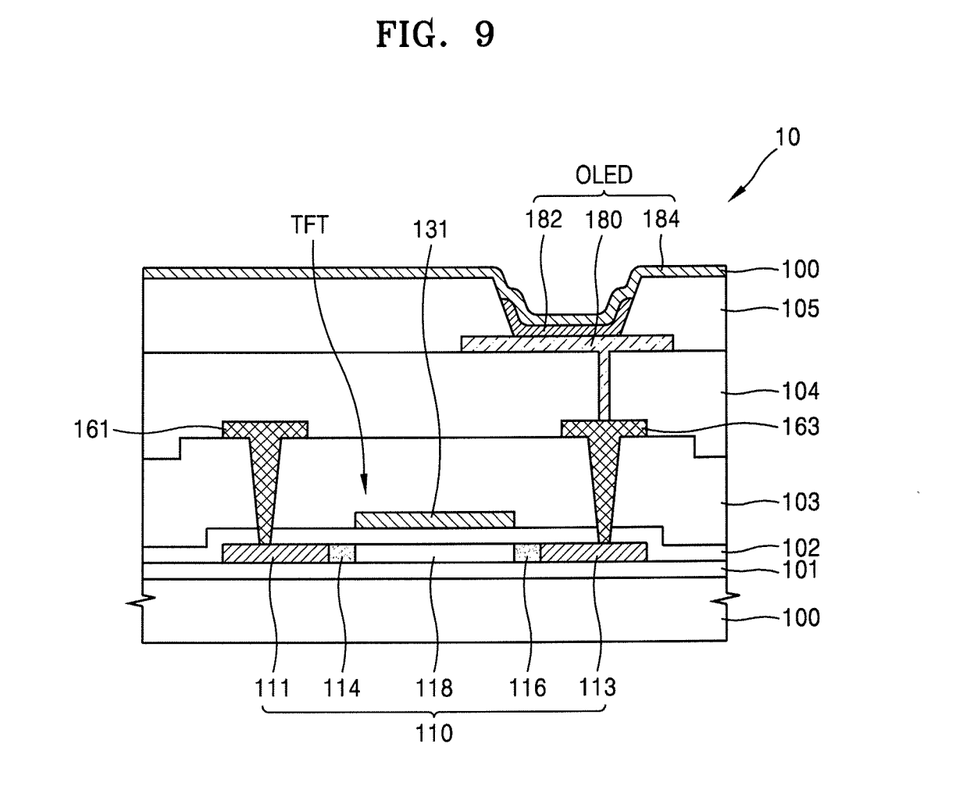
FIG. 9 is a cross-sectional view of an organic light-emitting display apparatus including the thin-film transistor substrate of FIG. 1.

FIG. 9 is a cross-sectional view of an organic light-emitting display apparatus including the thin-film transistor substrate of FIG. 1.

Referring to FIG. 9, in an organic light-emitting display apparatus 10, a second insulating film 103 may be formed on the thin-film transistor substrate 1 of FIG. 1, and contact holes exposing parts of the source and drain regions 111 and 113 may be formed in the second insulating film 103 and the gate insulating film 102. A second conductive layer may be formed and patterned. Thus, source and drain electrode wires 161 and 163 may be formed on the second insulating film 103, and may be electrically connected to the source and drain regions 111 and 113 (e.g., source and drain electrodes), respectively, through the contact holes. The source and drain regions 111 and 113 may be relatively highly concentrated doping regions.

The source electrode wire 161 and the drain electrode wire 163 may each include a single layer or a multi-layer including at least one metal from among, for example, Al, Pt, Pd, Ag, Mg, Au, Ni, Nd, Ir, Cr, Li, Ca, Mo, Ti, W, and Cu.

A planarization film 104 may be formed on the source and drain electrode wires 161 and 163, and a pixel electrode 180 may be disposed on the planarization film 104. The pixel electrode 180 may be connected to the drain electrode wire 163 through a contact hole formed in the planarization film 104.

The planarization film 104 may include an inorganic insulating film and/or an organic insulating film. The inorganic insulating film may include $SiO2$, $SiNx$, $SiON$, $Al_2O_3$, $TiO_2$, $Ta_2O_5$, $HfO_2$, $ZrO_2$, BST, and/or PZT, and the organic insulating film may include a general polymer (e.g., PMMA or PS), phenol-based group polymer derivative, acryl-based polymer, imide-based polymer, aryl ether-based polymer, amide-based polymer, fluoro-based polymer, vinyl alcohol-based polymer, and/or a blend thereof. The planarization film 104 may have a complex stacked structure of an inorganic insulating film and an organic insulating film.

An organic light-emitting device OLED may be formed on the planarization film 104, and the organic light-emitting device OLED may include the pixel electrode 180, an intermediate layer 182, and a counter electrode 184.

The pixel electrode 180 may be formed on the planarization film 104, and may be electrically connected to the drain electrode wire 163 through the contact hole formed in the planarization film 104.

The pixel electrode 180 may be, for example, a reflective electrode, and may include a reflective film including Ag, Mg, Al, Pt, Pd, Au, Ni, Nd, Ir, Cr, or a compound thereof, and a transparent or semi-transparent electrode layer may be formed on the reflective film.

The transparent or semi-transparent electrode layer may include at least one material from among indium tin oxide (ITO), indium zinc oxide (IZO), zinc oxide (ZnO), indium oxide ($In_2O_3$), indium gallium oxide (IGO), and aluminum zinc oxide (AZO).

The counter electrode 184 may face the pixel electrode 180. The counter electrode 184 may be a transparent or semi-transparent electrode, and may include a metal thin film having a relatively low work function and including Li, Ca, LiF/Ca, LiF/Al, Al, Ag, Mg, or a compound thereof. An auxiliary electrode layer or a bus electrode may be formed on the metal thin film by using a transparent electrode forming material, such as ITO, IZO, ZnO, or $In_2O_3$.

The counter electrode 184 may transmit light emitted from an organic emission layer included in the intermediate layer 182. Light emitted from the organic emission layer may be transmitted to the counter electrode 184 directly or may be reflected by the pixel electrode 180 including a reflective electrode.

However, the organic light-emitting display apparatus 10 according to an exemplary embodiment of the present invention is not limited to a top-emission type, and may be a bottom-emission type in which light emitted from the organic emission layer may e emitted towards the substrate 100. The pixel electrode 180 may be a transparent or semi-transparent electrode, and the counter electrode 184 may be a reflective electrode. The organic light-emitting display apparatus 10 according to an exemplary embodiment of the present invention may be a dual-emission type in which light is emitted in a plurality of directions.

A pixel-defining film 105 may be formed on the pixel electrode 180. The pixel-defining film 105 may include an insulating material. The pixel-defining film 105 may include at least one organic insulating material from among polyimide, polyamide, acryl resin, benzocyclobutene, and phenol resin. The pixel-defining film 105 may be formed via a spin coating method. The pixel-defining film 105 may expose a region of the pixel electrode 180, and the intermediate layer 182 including the organic emission layer may be disposed in the exposed region.

The organic emission layer included in the intermediate layer 182 may include a low molecular organic material or a high molecular organic material, and the intermediate layer 182 may include at least one of functional layers, such as a hole transport layer (HTL), a hole injection layer (HIL), an electron transport layer (ETL), and an electron injection layer (EIL).

In exemplary embodiments of the present invention, the thin-film transistor substrate according to exemplary embodiments of the present invention may include the gate electrode 131, but exemplary embodiments of the present invention are not limited thereto. The thin-film transistor substrate may include the thin-film transistor TFT disposed on the substrate 100. The thin-film transistor TFT may be formed on the substrate 100, the source and drain electrode wires 161 and 163 may be formed on the thin-film transistor TFT, the planarization film 104 may be formed on the thin-film transistor TFT, or the pixel electrode 180 may be formed on the thin-film transistor TFT.

According to a method of manufacturing a thin-film transistor substrate according to one or more exemplary embodiments of the present invention, widths of LDD regions disposed at sides of a gate electrode may be substantially symmetrical even when a mask has an alignment error.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A method of manufacturing a thin-film transistor substrate, the method comprising:
   forming a semiconductor pattern layer on a substrate;
   forming a first insulating film on the semiconductor pattern layer;
   forming, on the first insulating film, a metal pattern layer comprising a gate electrode and first and second alignment electrodes respectively spaced apart from two sides of the gate electrode;
   forming a cover layer covering the gate electrode, and removing the first and second alignment electrodes, wherein the cover layer is formed by forming a photoresist layer on the metal pattern layer, and then exposing and developing the photoresist layer by using a first mask having a first pattern, wherein a width of the first pattern is larger than a width of the cover layer;
   performing a first doping process by doping the semiconductor pattern layer with a first impurity by using the cover layer as a mask;
   removing the cover layer; and
   performing a second doping process by doping the semiconductor pattern layer with a second impurity having a lower impurity concentration than the first impurity by using the gate electrode as a mask.

2. The method of claim 1, wherein, in the performing of the first doping process, the semiconductor pattern layer comprises a first region, and second and third regions respectively disposed at two sides of the first region, and wherein the second and third regions are doped with the first impurity.

3. The method of claim 2, wherein, in the performing of the second doping process, the first region of the semiconductor pattern layer comprises a fourth region corresponding to a center region of the first region, and fifth and sixth regions respectively disposed at two sides of the fourth region, wherein the fifth and sixth regions are doped with the second impurity, and the second and third regions are again doped with the second impurity.

4. The method of claim 3, wherein the fourth region is formed at a location corresponding to the gate electrode and has substantially a same width as the gate electrode.

5. The method of claim 2, wherein a width of the cover layer is substantially the same as a width of the first region.

6. The method of claim 1, wherein the photoresist layer comprises a pre-cover layer having substantially a same width as the first pattern via exposure, and wherein while developing the photoresist layer, the width of the pre-cover layer is reduced to a width of the cover layer.

7. The method of claim 6, wherein the pre-cover layer comprises first and second end regions respectively disposed at sides of the pre-cover layer, and wherein the first and second end regions are moved towards a center of the cover layer while developing the photoresist layer.

8. The method of claim 7, wherein the amount of light incident on at least one of the first and second end regions of the pre-cover layer increases as a distance between the at least one of the first and second end regions and one of the first and second alignment electrodes, which is adjacent to the at least one of the first and second end regions, decreases.

9. The method of claim 8, wherein a moving distance of the at least one of the first and second end regions increases as the distance between the at least one of the first and second end regions and one of the first and second alignment electrodes, which is adjacent to the at least one of the first and second end regions, decreases.

10. The method of claim 1, wherein the photoresist layer comprises a positive type photoresist.

11. The method of claim 10, wherein the first pattern comprises a light blocker.

12. The method of claim 1, wherein the first impurity and the second impurity are a same material.

13. The method of claim 1, wherein the first and second alignment electrodes are removed via wet-etching.

14. The method of claim 1, wherein a width of the metal pattern layer is smaller than a width of the semiconductor pattern layer.

15. The method of claim 1, wherein the first and second alignment electrodes are respectively spaced apart from the two sides of the gate electrode at an equal distance.

16. A method of manufacturing a thin-film transistor substrate, the method comprising:
   forming a semiconductor pattern layer on a substrate;
   forming a first insulating film on the semiconductor pattern layer;
   forming a metal pattern layer comprising a gate electrode on the first insulating film;
   forming a photoresist layer on the metal pattern layer;
   exposing and developing the photoresist layer to form a cover layer, wherein the exposing is performed using a mask having a mask pattern, and wherein the mask pattern is wider than a width of the cover layer;
   performing a first doping process by doping the semiconductor pattern layer with a first impurity by using the cover layer as a mask;

removing the cover layer; and performing a second doping process by doping the semiconductor pattern layer with a second impurity using the gate electrode as a mask.

17. The method of claim 16, wherein the metal pattern layer further comprises first and second alignment electrodes, and wherein the first and second alignment electrodes are removed after forming the cover layer.

18. The method of claim 16, wherein the second impurity has a lower concentration than the first impurity.

19. The method of claim 16, wherein a width of the metal pattern layer is smaller than a width of the semiconductor pattern layer.

* * * * *